(12) United States Patent
Miyata et al.

(10) Patent No.: US 7,863,204 B2
(45) Date of Patent: Jan. 4, 2011

(54) SUBSTRATE PROCESSING APPARATUS, HEATING APPARATUS FOR USE IN THE SAME, METHOD OF MANUFACTURING SEMICONDUCTORS WITH THOSE APPARATUSES, AND HEATING ELEMENT SUPPORTING STRUCTURE

(75) Inventors: Toshimitsu Miyata, Toyama (JP); Akira Hayashida, Toyama (JP); Masakazu Shimada, Toyama (JP); Kimio Kitamura, Osaka (JP); Kenji Tanaka, Osaka (JP)

(73) Assignees: Hitachi Kokusai Electric Inc., Tokyo (JP); Teitokusha Co., Ltd., Osaka (JP)

( * ) Notice: Subject to any disclaimer, the term of this patent is extended or adjusted under 35 U.S.C. 154(b) by 330 days.

(21) Appl. No.: 11/990,519

(22) PCT Filed: Aug. 23, 2006

(86) PCT No.: PCT/JP2006/316501

§ 371 (c)(1),
(2), (4) Date: Feb. 15, 2008

(87) PCT Pub. No.: WO2007/023855

PCT Pub. Date: Mar. 1, 2007

(65) Prior Publication Data
US 2009/0035948 A1   Feb. 5, 2009

(30) Foreign Application Priority Data
Aug. 24, 2005   (JP)   ............................ 2005-243175

(51) Int. Cl.
*H01L 21/00* (2006.01)
(52) U.S. Cl. ............... 438/799; 118/641; 257/E21.497; 257/E21.002
(58) Field of Classification Search ................ 438/799; 219/390; 257/E21.497, E21.002; 118/641
See application file for complete search history.

(56) References Cited

U.S. PATENT DOCUMENTS

| 5,506,389 | A | * | 4/1996 | Hidano et al. | ............... | 219/390 |
| 6,005,225 | A | * | 12/1999 | Kowalski et al. | ............ | 219/390 |
| 6,228,174 | B1 | * | 5/2001 | Takahashi | .................. | 118/725 |

FOREIGN PATENT DOCUMENTS

| JP | 11-067424 A | 3/1999 |
| JP | 2005-150101 A | 6/2005 |

OTHER PUBLICATIONS

International Search Report mailed on Nov. 28, 2006.

* cited by examiner

*Primary Examiner*—Caridad M Everhart
(74) *Attorney, Agent, or Firm*—Rader, Fishman & Grauer PLLC (57) ABSTRACT

A substrate treating device comprising a treatment chamber for storing and treating substrates and a heating device having a heating element and a heat insulator and heating the substrates in the treatment chamber by the heating element. The heating element is so formed that only its one end is held by a holding part, and a projection projected to the treatment chamber side at the intermediate part of the heating element and positioned in proximity to or in contact with the heating element is formed on the heat insulator. A pin with an enlarged part is passed through the heating element and the heat insulator at the intermediate part of the heating element and the enlarged part is positioned in proximity to or in contact with the heating element. The plurality of projections may be formed on the heat insulator and the pins may be disposed between these plurality of projections.

22 Claims, 8 Drawing Sheets

SUBSTRATE PROCESSING APPARATUS, HEATING APPARATUS FOR USE IN THE SAME, METHOD OF MANUFACTURING SEMICONDUCTORS WITH THOSE APPARATUSES, AND HEATING ELEMENT SUPPORTING STRUCTURE

TECHNICAL FIELD

The present invention relates to a substrate processing apparatus for producing semiconductor devices on a substrate such as a silicon wafer or a glass substrate, a heating apparatus for use in the substrate processing apparatus, a method of manufacturing semiconductors with those apparatuses, and a heating element supporting structure.

DESCRIPTION OF THE RELATED ART

Among the apparatuses for producing semiconductor devices is a substrate processing apparatus designed for conducting deposition of thin layers, annealing, diffusion of impurities, and etching processed over a substrate such as a silicon wafer or a glass substrate. Such a substrate processing apparatus is classified into a multiple type for processing one or more wafers in a sequence and a batch type for processing prescribed numbers of wafers at once. The batch type substrate processing apparatus is also classified into a vertical type employing a vertical furnace and a horizontal type employing a horizontal furnace.

For example, disclosed in Patent Citation 1 therein is a conventional substrate processing apparatus of the batch type employing a vertical furnace. Also a known electric heater is disclosed in Patent Citation 2.

Patent Citation 1: Japanese Patent Laid-open Publication No. (Heisei) 11-67424

Patent Citation 2: Japanese Patent Laid-open Publication No. 2005-150101.

Figure 7:
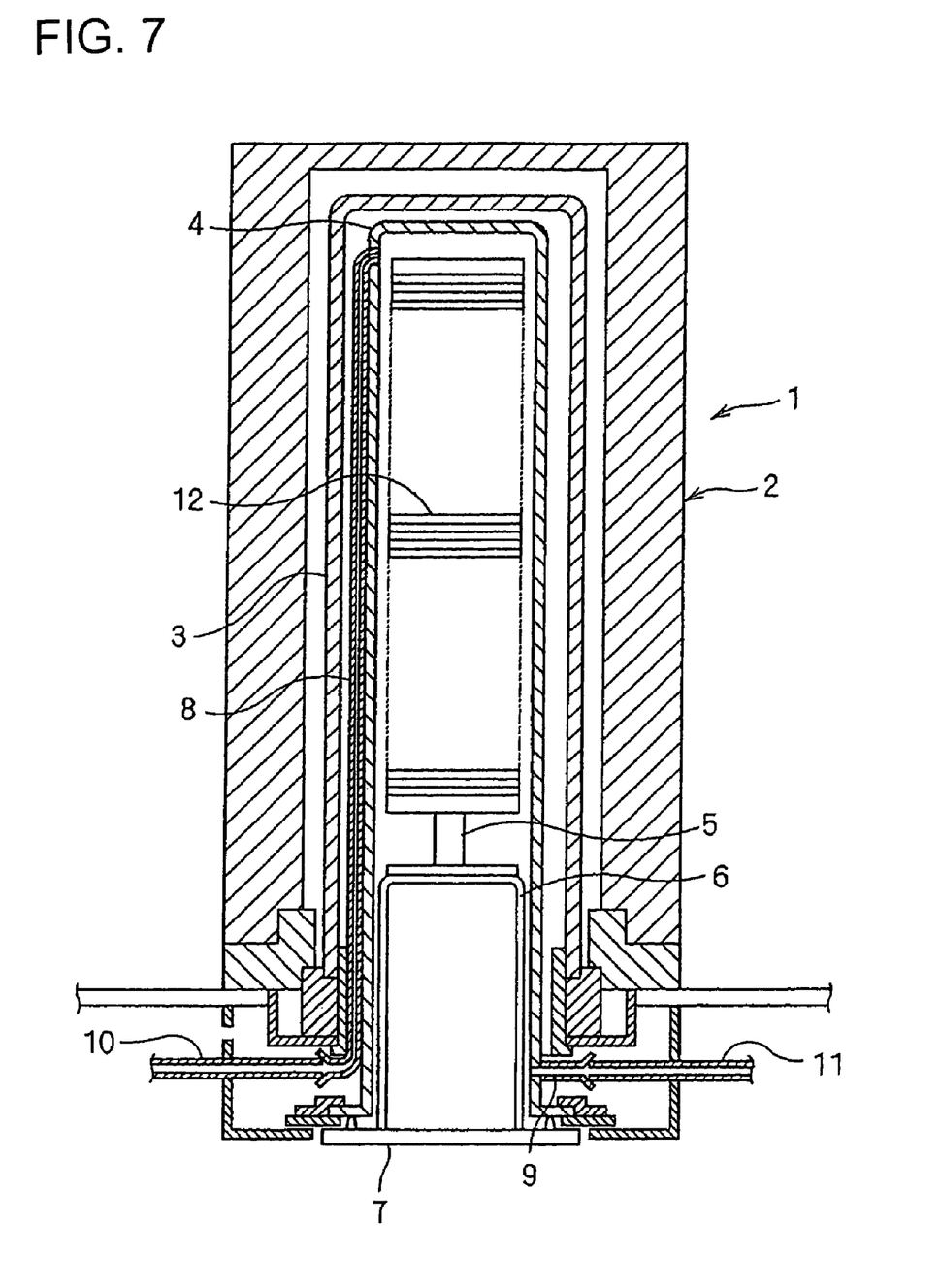
FIG. 7 is a cross sectional view of a conventional substrate processing apparatus.

Referring to FIG. 7, the vertical furnace denoted by 1 in the conventional substrate processing apparatus will be explained.

There are a heating module 2 of a tubular shape, a thermal equalizer tube 3 disposed in the heating module 2, and a reactor tube 4 disposed in the thermal equalizer tube 3 which are assembled coaxially in a one-over-another relationship. A boat 5 is installed in the reactor tube 4. The boat 5 is joined by a boat cap 6 to an elevator cap 7 for supporting a group of wafers 12 horizontally in layers. The elevator cap 7 is linked to a boat elevator, not shown, for being lifted up and down.

A gas feed conduit 8 is provided as communicated with the upper end of the reactor tube 4 which is also communicated at the lower end with an exhaust outlet 9. The gas feed conduit 8 is connected at the lower end to a gas supply conduit 10 while the exhaust outlet 9 is connected to an exhaust conduit 11.

When the boat 5 remains removed out from the reactor tube 4, it receives and carries required numbers of wafers 12 thereon. Then, the boat 5 is lifted up by the action of the boat elevator (not shown) and its wafers 12 are loaded into the reactor tube 4. The interior of the reactor tube 4 is heated up prescribed temperature by the heating module 2 and filled with reactive gases supplied from the gas supply conduit 10 and the gas feed conduit 8. This allows thin layers to be deposited on the wafers 12. The gases after reaction are discharged from the exhaust outlet 9 and the exhaust conduit 11.

Figure 8:
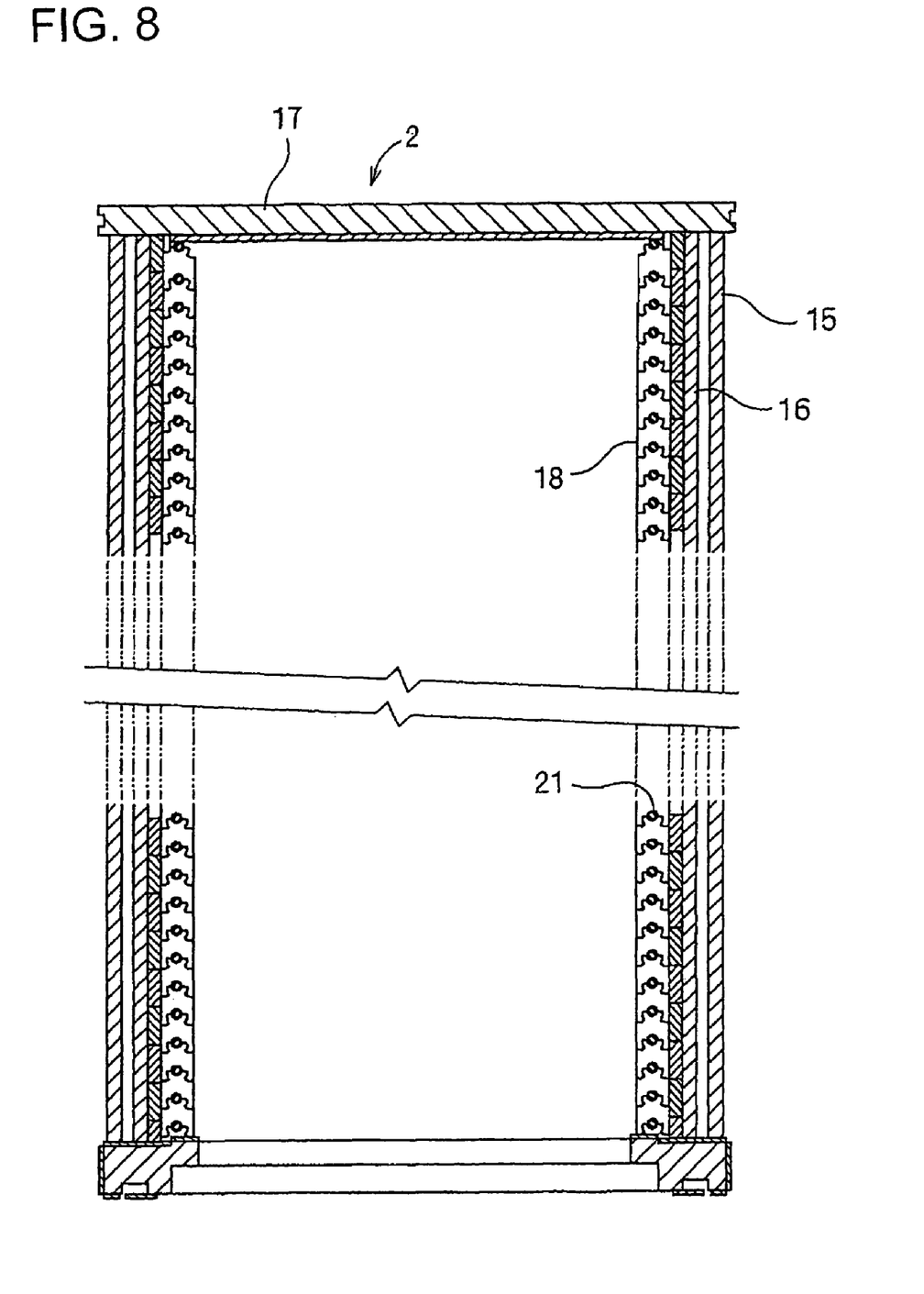
FIG. 8 is a vertically cross sectional view of a heating module in the conventional apparatus.
Figure 9:
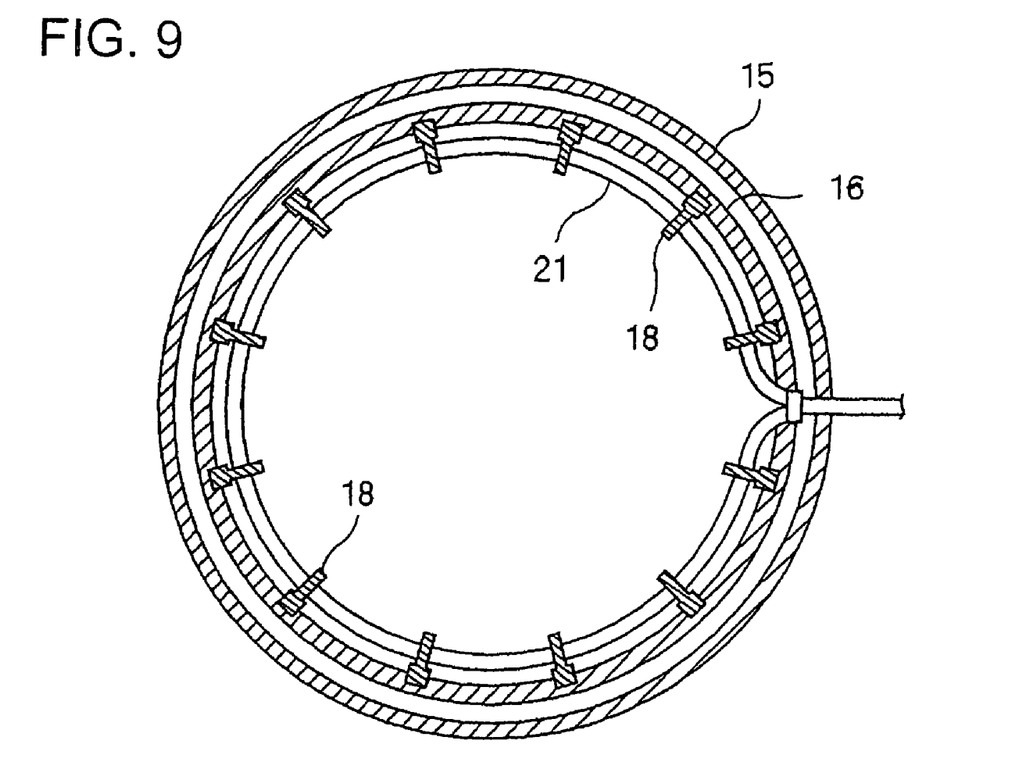
FIG. 9 is a cross sectional plan view of the heating module in the conventional apparatus.
Figure 10:
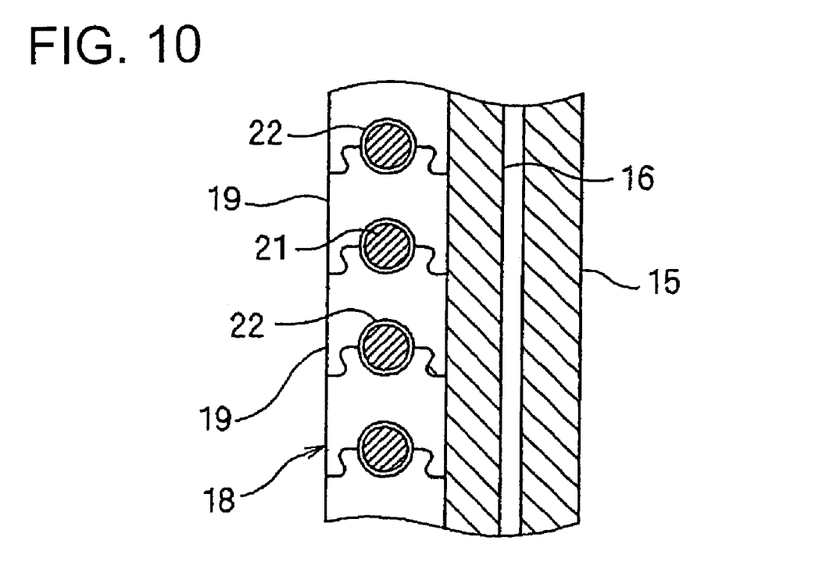
FIG. 10 is a partially cross-sectional view of the heating module in the conventional apparatus, in which the primary components are.

The heating module 2 will now be described in more detail referring to FIGS. 8 to 10.

Peripheral thermal insulators 15, 16 at a tubular shape are provided concentrically of the reactive tube 4. The peripheral thermal insulators 15, 16 are closed at the upper end with a ceiling thermal insulator 17. The peripheral thermal insulator 15 is covered at the outer side with a heater case not shown.

A set of vertically extending supports 18 are provided on the inner wall of the peripheral thermal insulator 16 as separated at required equal intervals along the circumference. Each of the supports 18 comprises a row of supporting pieces 19 made of high alumina (containing 94.2% of alumina) and joined to one another along the vertical. There is a heating wire 21 described later is extended through a holding aperture 22 provided between any two adjacent supporting pieces 19.

The heating wire 21 which is round in the cross section is arranged in a coil form to surround the thermal equalizer tube 3. The heating wire 21 extending through the holding apertures 22 is securely held by the supporting pieces 18 at required equal intervals of the circumference.

During the action of depositing the thin layers on the wafers 12 in the vertical furnace 1, the heating wire 21 heats up and expands thus to increase the diameter of its coil form, and the power acts on supporting pieces 18 in a direction opposite to the center of the vertical furnace 1. This causes the supporting pieces 18 to move together with the heating wire 21 in a direction opposite to the center of the vertical furnace 1. Simultaneously, the peripheral thermal insulator 16 is heated up to a higher temperature by the heating wire 21 thus expanding.

When the heating wire 21 has stopped its heating action at the end of the layer depositing action, its temperature drops down thus to decrease the diameter of its coil form, and the power acts on supporting pieces 18 in a direction towards the center of the vertical furnace 1. This causes the supporting pieces 18 to move together with the heating wire 21 in a direction towards the center of the vertical furnace 1. Simultaneously, the peripheral thermal insulator 16 is cooled down and shrunk as the temperature of the heating wire 21 drops down.

As the temperature in the vertical furnace 1 is repeatedly increased and decreased for depositing the layers on the wafers 12, the heating wire 21 and the peripheral thermal insulator 16 repeat their expanding and shrinking action.

However in the conventional heating module described above, in structure of the supporting pieces, the relative displacement of along the circumference to each other is not regulated. When the temperature in the vertical furnace is repeatedly increased and decreased, the heating wire and the thermal insulator repeat their expanding and shrinking action thus causing the supporting pieces to remove from the thermal insulator and also displace relatively from each other along the circumference. As the result, the supporting pieces may be separated from each other, hence creating direct contact or short circuit between any two regions of the heating wire.

Moreover, as the heating wire repeats its expanding and shrinking action, it will move together with the supporting pieces radially of the vertical furnace or be deformed irregularly due to its thermal distortion. When its deformation occurs along the circumference, the heating wire may come into direct contact between its different regions. When its deformation occurs along the radial direction, the heating wire may come into direct contact with the thermal equalizer tube which is electrically conductive.

Meanwhile, the arrangement disclosed in Patent Citation 2 is known in that a heating member is fixed at one end and arranged free at the other end while supported by a pin or the like. However, the heating member fails to be protected from being thermally deformed at its center region. Therefore, its counter measurement should be taken carefully for practical use in the semiconductor process.

DISCLOSURE OF THE INVENTION

Problems that the Invention is to Solve

It is hence an object of the present invention in view of the foregoing aspects to securely hold each of heating elements without interrupting its uniform heating action while minimizing the generation of thermal distortion on the heating element and inhibit the heating element from coming into direct contact with another heating element or any component such as a thermal equalizer tube for lengthening the operational life of the heating element.

Means for Solving the Problems

For achievement of the object of the present invention, a substrate processing apparatus is provided comprising: a processing chamber where wafers are accommodated and processed; and a heating module equipped with heating elements and thermal insulator materials for heating the wafers with the heating elements in the processing chamber, wherein each of the thermal insulator materials is arranged to have a supporting portion thereof provided for supporting the heating element, each of the heating elements is arranged to have a slit provided therein and to be supported at one end along the lengthwise direction of the slit by the supporting portion of the thermal insulator material so that a space is provided between the inner side of the thermal insulator material and the heating element, the thermal insulator material also has a projection provided on the inner side thereof to extend at an intermediate of the heating element towards the processing chamber so as to come adjacent to or in direct contact with the heating element, and at least a pin provided with an enlarged portion is disposed to extend at the intermediate of the heating element across the slit and the thermal insulator material with its enlarged portion sized greater in the width than the slit and placed adjacent to or in direct contact with the heating element at the processing chamber side of heating element. It is noted that the term "adjacent to" means to come not into direct contact to but very close to. For preventing any deformation, the heating element comes into direct contact with the "projection and/or enlarged portion". The term "adjacent to or indirect contact with" will hence be referred to as "adjacent to or the like" herein after.

ADVANTAGES OF THE INVENTION

According to the present invention, there are provided the processing chamber where the wafers are accommodated and processed and the heating module equipped with the heating elements for heating the interior of the processing chamber with the heating elements. Since the heating element is held at one end by the supporting portion, it can be protected from buckling when its temperature increases and its physical strength is declined. Accordingly, the heating element is prevented from coming into direct contact with another heating element or any other component such as a thermal equalizer tube while remaining controlled for not being suffered from thermal distortion and can thus be increased in the operational life, such superior effects are shown.

Also, as the heating element is spaced at its intermediate from its electrically insulating material, its radiation of heat can be improved thus ensuring a uniform heating action.

Moreover, the heating element is held at one end by the supporting portion, it is prevented from being slipped off, and can support it surely when its thermal expansion or deformation occurs. This allows the assembling action to require no particular accuracy and thus contribute to the cost down of the apparatus.

The heating element is protected by the projection(s) from being deflected towards its backside and by the enlarged portion of the pin(s) from being deflected towards the center of the processing chamber while remaining free for deflection in the downward direction. This can prevent any twisting or fracturing action of the heating element which may result from its thermal expansion forcefully inhibited. Simultaneously, the heating element can be protected at its intermediate region from coming into direct contact with another heating element or a reactor tube or its supporting insulator material due to its thermal expansion (thus avoiding loss in the heating which may result from the unexpected direct contact with the insulator material). Accordingly, the temperature control at higher precision which is essential in the practice of any semiconductor process can be enabled.

Other objects, arrangements, and advantages of the present invention will be apparent from the following description of the preferred embodiments.

2: heating module, 3: thermal equalizer tube, 4: reactor tube, 5: boat, 12: wafer, 24: tubular space, 25: heater unit, 26: heater case, 27: ceiling, 28: exhaust passage, 31: reactive gas supply conduit, 32: exhaust conduit, 33: flow controller, 34: pressure controller, 35: furnace internal space, 36: cooling gas infeed duct, 37, 38: cooling gas supply conduits, 39: thermal equalizer tube space, 40, 41: air valves, 42: outer thermal insulator, 43: heating element, 43a: bent portion, 43b: main part, 43x, 43y: ends, 45: inner thermal insulator, 46: pin, 46a: enlarged portion (washer), 46b: centerbore, 47: main controller, 48: temperature controller, 49: gas flow controller, 50: pressure controller, 51: drive controller, 52: heater temperature detector, 53: furnace temperature detector, 55: heater cover, 56: thermal insulator material (electrical insulator material), 56a to 56d: first to fourth segments, 56h: through hole, 56t: projection, 57: heating element block, 59: (heater) support, 59a: slot, 59b: retainer, 61: lower supporting member, 62: upper supporting member, 63: downward rib, 64: heating element holding groove, 65: slit, 65a: downwardly open slit, 65b: upwardly open slit, 66: insulator piece.

BEST MODES FOR EMBODYING THE INVENTION

Some preferred embodiments of the present invention will be described referring to the relevant drawings.

Figure 1:
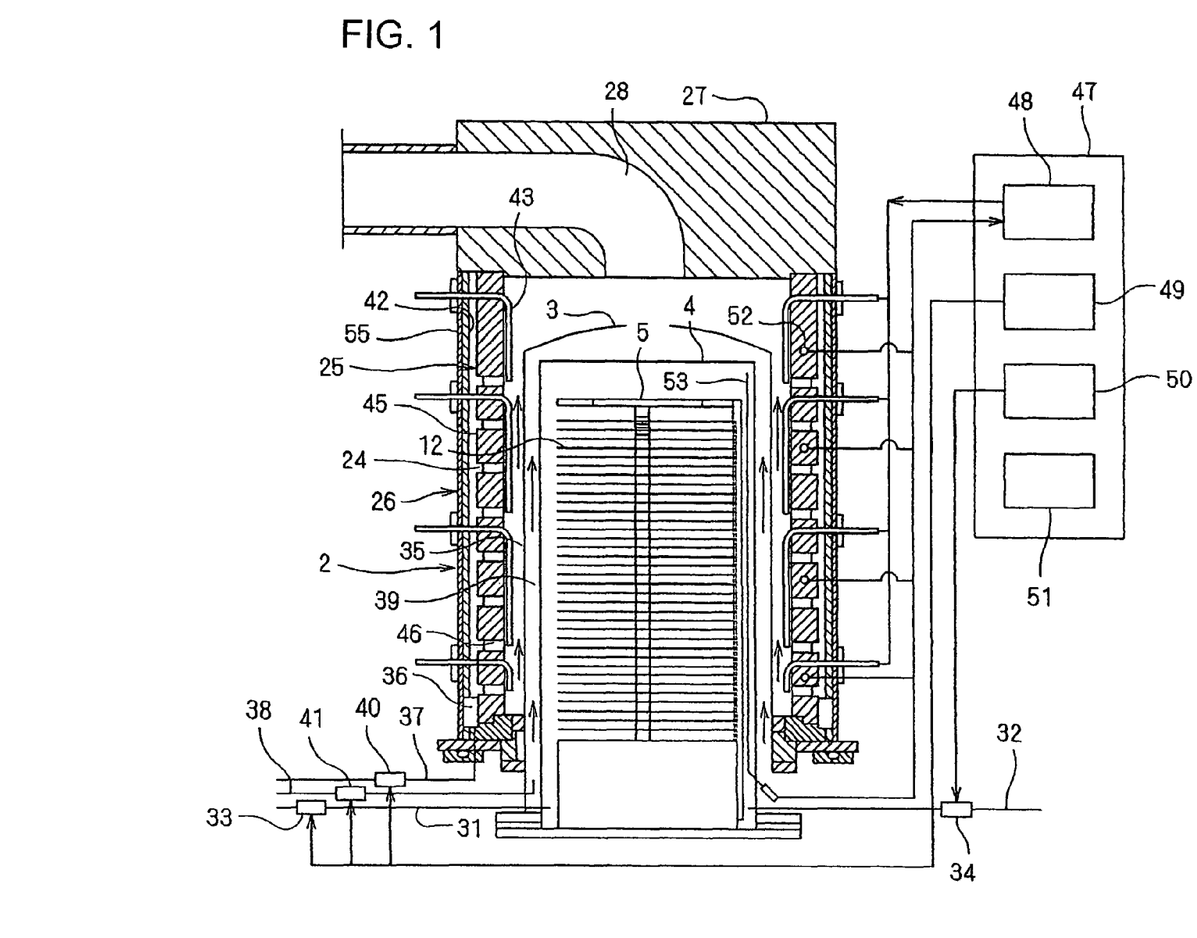
FIG. 1 is a schematic cross sectional view of a vertical furnace in a substrate processing apparatus showing one embodiment of the present invention.
Figure 5:
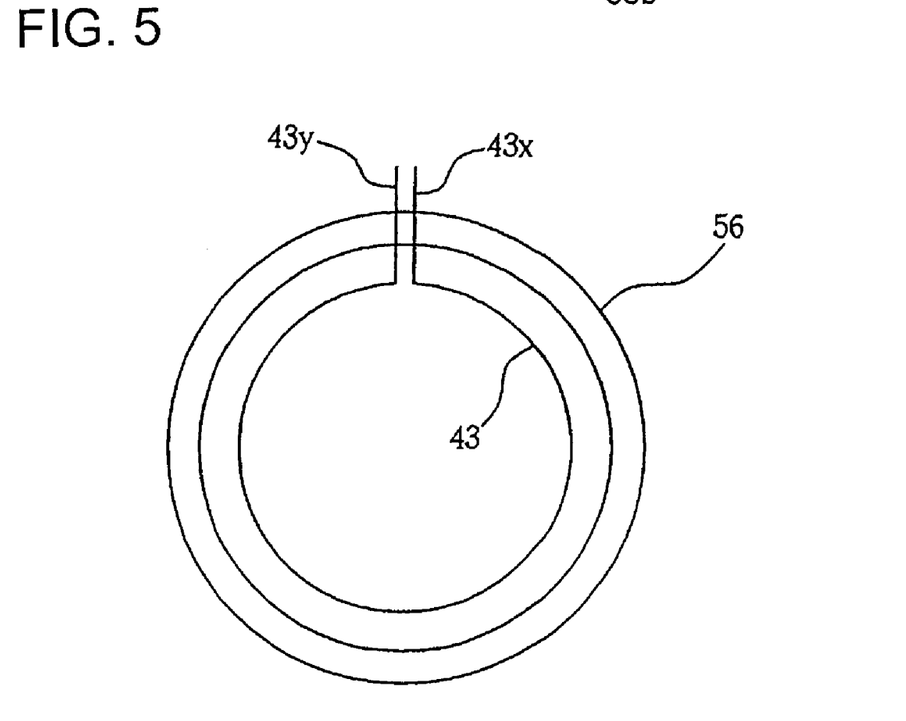
FIG. 5 is a schematic diagram showing an arrangement of wiring in the heating element.

Referring to FIG. 1, the description starts with illustrating a substrate processing apparatus according to the present invention. In FIG. 5, like components are denoted by like numerals as those in FIG. 1.

A thermal equalizer tube 3 and a reactor tube 4 are provided concentrically in a heating module 2 of a tubular shape. The reactor tube 4 has a processing chamber provided therein where a boat 5 is installed to carry a group of horizontally placed wafers 12 in layers. The boat 5 can be loaded in and out from the processing chamber by the action of a boat elevator not shown.

The reactor tube 4 is communicated with a reactive gas supply conduit 31 and an exhaust conduit 32. A flow controller 33 is provided across the reactive gas supply conduit 31 while a pressure controller 34 is provided across the exhaust conduit 32. This allows each reactive gas to be introduced at a predetermined flow amount and maintained at a desired pressure in the reactive tube 4 and exhaust gas is discharged. The boat 5 and the boat elevator etc. are identical in the arrangement to those of the conventional substrate processing apparatus described previously and will be explained in no more detail.

The heating module 2 comprises a heater unit 25 and a heater case 26 which is arranged to surround the heater unit 25 as separated by a tubular space 24 from the heater unit 25. A heater case 26 functions as outer the thermal insulator portion. The heater unit 25 and the heater case 26 are covered at the upper end with a ceiling unit 27. The ceiling unit 27 has an exhaust passage 28 provided therein in an elbow shape to open at one side and the lower side.

The exhaust passage 28 is communicated with a forced exhaust conduit equipped with an exhaust blower (not shown) for conducting a forced exhausting action.

The heater unit 25 is also surrounded at the lower end by a cooling gas infeed duct 36 which is communicated with the tubular space 24.

The cooling gas infeed duct 36 is also communicated to a cooling gas supply conduit 37 while another cooling gas supply conduit 38 is communicated to a thermal equalizer tube space 39 defined between the thermal equalizer tube 3 and the reactor tube 4. Both the cooling gas supply conduits 37, 38 are equipped with a couple of air valves 40, 41 respectively.

The heater case 26 comprises a metallic heater cover 55 and an outer thermal insulator 42 of a tubular shape. The heater unit 25 comprises heating elements 43 and an inner thermal insulator 45 etc. arranged to support the heating elements 43. The heating elements 43 are disposed on the inner side at entirety of the inner thermal insulator 45.

The outer thermal insulator 42 and the inner thermal insulator 45 are made of a material containing mainly alumina (aluminum oxide, $Al_2O_3$) and silica ($SiO_2$). Also, the heating elements 43 are made of a heating material, such as Fe—Al—Cr alloy which can rapidly heat up and arranged of a sheet-like shape etc. having a cross section for increasing the heating surface area.

The heater unit 25 includes a group of heating element blocks 57 on which the heating elements 43 are mounted respectively, as will be described later in more detail. The heating elements 43 are separated along the axis of the heating module 2 into zone groups as will be described later in more detail, zone control is enabled. Each zone is provided with a heater temperature detector 52 for measuring the temperature at the zone. The heating elements 43 may be patterned equally in the zones for producing the same energy of heating.

The action of processing the wafers 12 in the reactor tube 4 can be controlled by a main controller unit 47. The main controller unit 47 comprises a temperature controller 48 for controlling the temperature in the furnace, a gas flow controller 49 for controlling the flow of processing gas and cooling gas, a pressure controller 5 of or controlling the pressure in the reactor tube 4, and a drive controller 51 for controlling the action of actuators including the boat elevator etc.

A furnace temperature detector 53 is provided vertically along the inner side of the reactor tube 4. The furnace temperature measured by the furnace temperature detector 53 and the heater temperature measured by the heater temperature detectors 52 are received by the temperature controller 48. While controlling the opening and closing action of the air valves 40, 41, the gas flow controller 49 drives the flow controller 33 to determine the supply of a gas. At the same time, the pressure controller 50 drives the pressure controller 34 to control the exhaust of the gas and thus determine the pressure in the reactor tube 4.

The heater unit 25 will now be described.

The inner thermal insulator 45 comprises a group of thermal insulator materials 56 (See FIG. 2) that are electrically insulating material of a short tubular shape placed one over another vertically and concentrically in a stack. Each of the thermal insulator material 56 is covered at its entire inner side with the heating element 43. As will be described later in more detail, every each step of the heating element 43 is controlled in heat, the heating element block 57 incorporates a combination of the heating element 43 and the thermal insulator material 56. A stack of the heating element blocks 57 placed one over another concentrically form the heating unit 25. The thermal insulator material 56 has a couple of projections 56t provided thereon and a couple of through holes 56h provide therein as spaced properly from each other.

The projections 56t are arranged of substantially a mesa shape in the cross section for providing a space between the heating element 43 and the thermal insulator material 56. This space protects the heating element from heating loss resulting form any direct contact with the thermal insulator material and thus contributes to the improvement of the radiation efficiency of the heating element 43 for increasing the effectiveness of the heating action and minimizing the deflection of the heating element 43 towards the thermal insulator material 56. More preferably, the projections 56t may be arranged of substantially a semi-circular shape in the cross section. This will maintain the physical strength of the projections 56t and permit the projections 56t to come into a linear contact with the heating element 43, thus further minimizing the heating loss resulting from the direct contact with the thermal insulator material.

Each of the through holes 56h is provided for communicating the tubular space 24 with a furnace internal space 35 between the heating unit 25 and the thermal equalizer tube 3 and arranged through which a pin 46 having a radially enlarged portion 46a thereof extend. The pin 46 is arranged of a cylindrical shape having a center bore 46b provided therein and inserted from a slit 65a of the heating element 43 into the through hole 56h. The center bore of the pin 46 open at one end to the inner side of the heating element 43 and is communicated at the other end to the tubular space 24. The heating element 43 is supported by the enlarged portions 46a of the pins 46 which are greater in the width than the slits 65a of the heating element 43. This inhibits the heating element 43 from deflecting towards the processing chamber side while the center bores of the pins 46 act as passages for feeding the cooling gas into the furnace. In this embodiment, while its enlarged portion 46a is implemented by a washer, the pin 46 is a two-piece assembly of the washer and a pin which are bonded to each other by an adhesive and will hence be reduced in the production cost.

The washer 46a and the pin 46 are made of an electrically insulating material having a degree of resistance to heat. The electrically insulating material remains intact when the temperature of the heating elements soars up and permits no short-circuit between the heating elements 43. The pin 46 of the cylindrical shape is mounted to the thermal insulator material 56 without coming into direct contact with the heating elements 43. As the heating elements 43 is protected from being cooled down locally through the pins 46 by the cooling gas, their local deformation or twisting can successfully be avoided thus not resulting into injury or breakage. Also, even if the heating element 43 is deformed by the effect of a temperature increase and comes into direct contact with the pin 46, it remains at a linear contact with the cylindrical shape of the pin 46 and can thus be prevented locally from being cooled down critically.

The heating element block 57 will now be described in more detail, referring to FIGS. 2 and 3.

Figure 2:
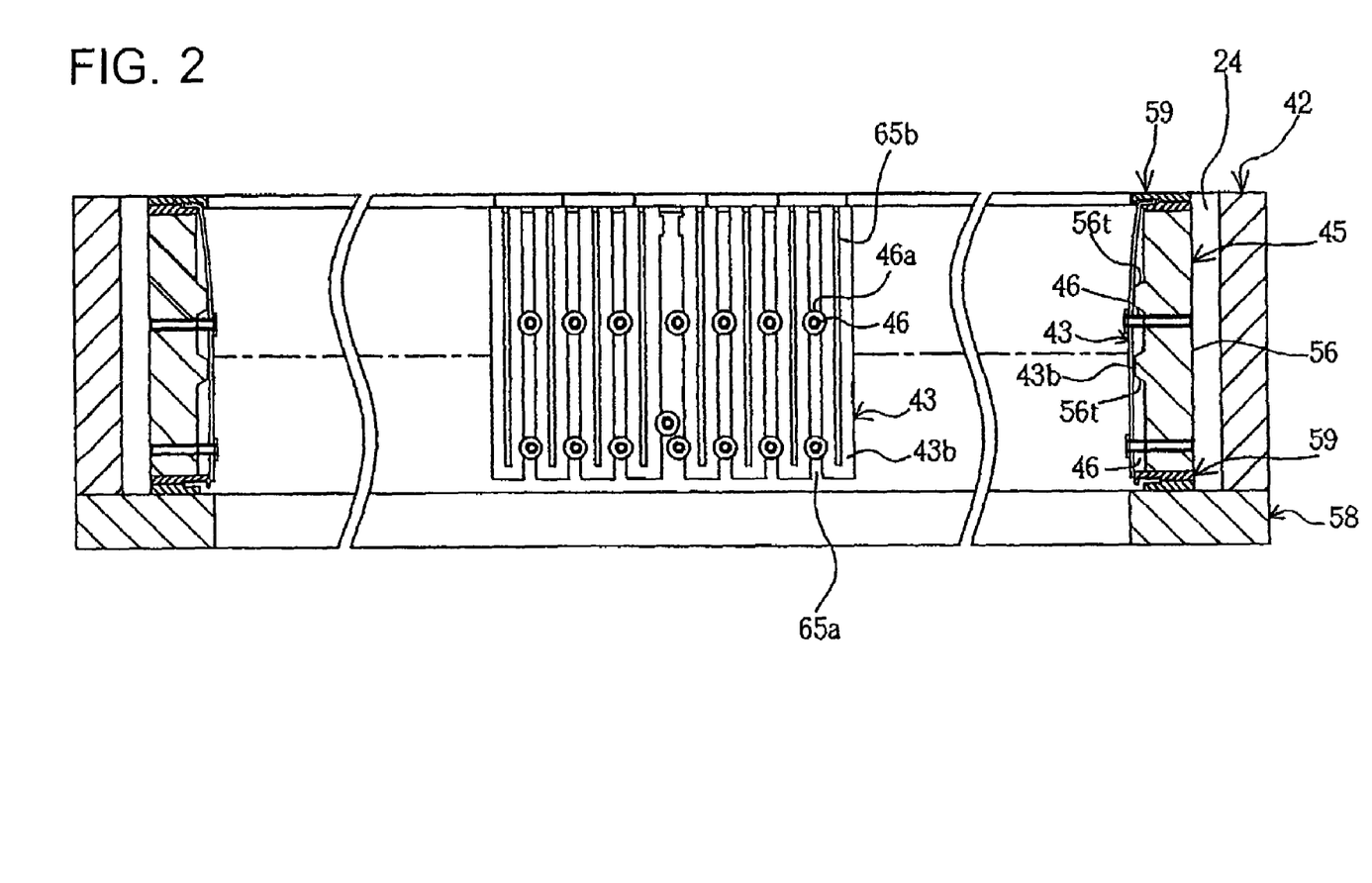
FIG. 2 is a partially cutaway cross sectional view of the lowest part of a heating module in the vertical furnace.
Figure 3:
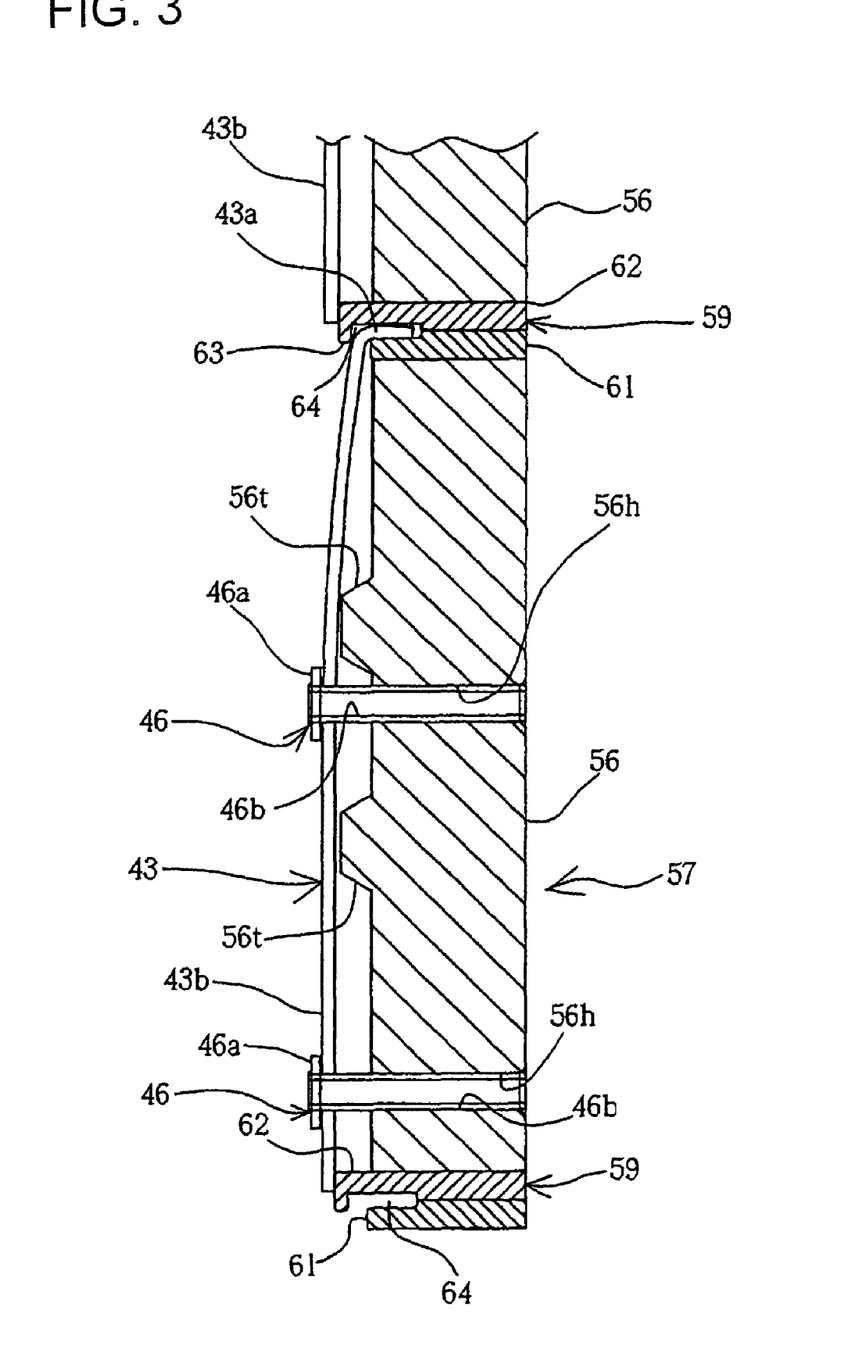
FIG. 3 is a cross sectional view of an inner thermal insulator in the heating module.

FIG. 2 illustrates the lowest of the heating element blocks 57. Denoted by 58 in FIGS. 2 and 3 is a thermal insulator base of a ring shape on which the outer thermal insulator 42 and the inner thermal insulator 45 are placed.

The thermal insulator material 56 is sandwiched between two heater supports 59, 59 that are heater-supporting portion at both the upper and lower ends. The heater support 59 comprises a lower supporting member 61 and an upper supporting member 62 joined to each other.

The lower supporting member 61 is arranged of an annular sheet-like shape which is equal in the outer diameter to and smaller in the inner diameter than the thermal insulator material 56. The inner end (at the edge department of the washer, See FIG. 1) of the lower supporting member 61 is extended inwardly to form a visor shape.

The upper supporting member 62 is also arranged of an annular sheet-like shape which is equal in the outer diameter to the thermal insulator material 56 and smaller in the inner diameter than the lower supporting member 61. The inner end of the upper supporting member 62 is inwardly extended longer than that of the lower supporting member 61. The upper supporting member 62 has a downward rib 63 provided on the inner end thereof so that it forms a hook-like shape at the inner end.

There is hence provided an annular, inwardly opening, heating element receiving groove 64 of a substantially hook-like shape in the cross section between the upper supporting member 62 and the downward rib 63, whereby one bent end 43a of the heating element 43 can be received by the heating element receiving groove 64. There are proper gaps provided along the upward and downward directions and the radial direction between the bent end 43a and the heating element receiving groove 64 while the downward rib 63 inhibits the removal of the bent end 43a of the heating element 43 towards the inward center.

Figure 4:
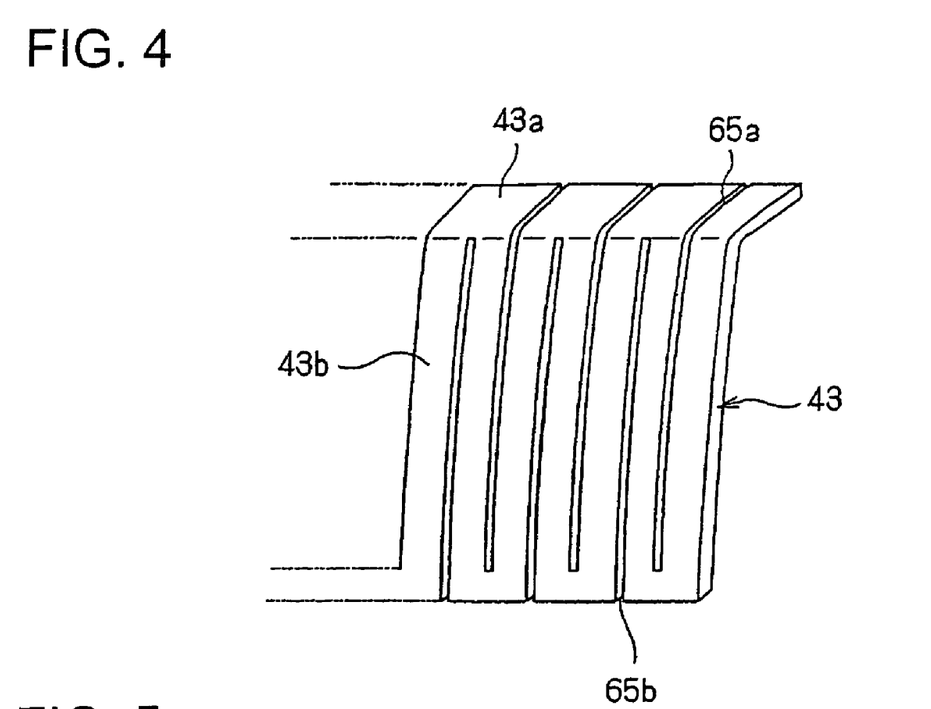
FIG. 4 is a perspective view of a heating element in the heating module.

The heating element 43 will be described referring to FIG. 4.

The heating element 43 is arranged of a laterally extending belt-like shape when opened, which has a series of slit pairs 65a, 65b cut alternately from both sides at equal intervals on a band plate thus forming a zigzag shape. The bent end 43a which is the upper end portion of the band plate is provided by outwardly bending one side of the belt-like shape to an obtuse angle slightly greater than ninety degrees to extend horizontally. This allows the bent end 43a to be sandwiched between the lower supporting member 61 and the upper supporting member 62.

The main part 43b of the heating element 43 extends downwardly along the projections 56t of the thermal insulator material 56 and securely supported at its center by one of the pins 46 with an enlarged portion. Also, the main part 43b remains in direct contact with the inner end of the upper supporting member 62 of the heater support 59 at the lowermost and is securely supported at its lower end by the other pin 46 with an enlarged portion. The lower pin 46 may be provided when the heating element 43 is significantly deflected towards the processing chamber side when its temperature rises up. This further inhibits the heating element 43 from being deflected towards the processing chamber side. When securely mounted, the main part 43b of the heating element 43 remains inwardly convexly curving or bending at an obtuse angle. Alternatively, a portion of the main part 43b may inwardly convexly curving or bending at an obtuse angle.

As the heating element blocks 57 are stuck one over another, their heating elements 43 remain at their lower end adjacent to or indirect contact with the upper supporting member 62. Also, the two heating elements 43 of any two adjacent heating element blocks 57 are separated from each other only by the gap equal to the length of the downward rib 63. Accordingly, the lower end of heating element 43 of the upper side can be placed over the upper end of heating element 43 of the lower side without producing any space between the two or with overlapping each other. Even if the heating element 43 at the upper side is expanded and lengthened downwardly by the action of heat, its direct contact with the other heating element 43 at the lower side can be avoided.

As the heating element 43 deflects along the inner side of the thermal insulator material 56, it forms substantially a short tubular shape which is concentric with the thermal insulator material 56. More particularly, as shown in FIG. 5, the leading and trailing ends of the heating element 43 are spaced from each other so as not to come into direct contact even when the heating element 43 expands along the circumferential direction. Also, the leading and trailing ends 43x, 43y of the heating element 43 are connected to the temperature controller 48. The connections between the heating element 43 and the temperature controller 48 are arranged flexible to accept some distortion. The heating elements 43 at the corresponding heating element blocks 57 can thus be thermally controlled separately by their respective temperature controllers 48.

The processing action will then be described.

The action of processing the wafers 12 starts with loading the boat 5 which carries the wafers 12 into the reactor tube 4 by the movement of the boat elevator (not shown) and rapidly heating up the same to a desired temperature by the heating action of the heating module 2. When the wafers 12 have been heated up to the desired temperature by the heating module 2, reactive gases are introduced from the reactive gas supply conduit 31. The action of thermally processing the wafers 12 is performed when the reactive gases have been removed out the exhaust conduit 32.

In common, the furnace is kept at a preset temperature, e.g., 550°, before the boat 5 is loaded in. When the boat 5 has been loaded in, the furnace is heated up to a desired, wafer processing temperature, e.g., 850°. Both the preset temperature and the wafer processing temperature can selectively be determined depending on the requirements of the processing action.

The heating element blocks 57 in the heating unit 25 are separated into zone groups which are separately controlled by their corresponding temperature controllers 48 while each of their respective heating elements 43 is a single element. This allows each of the heating elements 43 to be easily identified when its defect such as disconnection is found. The deterioration of each of the heating elements 43 can also be detected with ease.

Since the two heating elements 43 of any two, upper and lower, heating element blocks 57 in the heating unit 25 remain not spaced vertically from each other, no heating gap is provided. In addition, the heating element block 57 at the lowermost in the furnace is accompanied with the heating element 43, Accordingly, the heating unit 25 produces no heating gap and its thermal equalization in the furnace can be enhanced thus contributing to the uniformity of the wafer processing action.

When heating up, the heating element 43 increases its size due to the thermal expansion. However, the heating element 43 remains free at the lower end with its main part 43b distanced from the corresponding thermal insulator material 56. This allows the heating element 43 to stay not affected by any thermal distortion along the vertical but free from the thermal deformation. Also, the bent end 43a of the heating element 43 is held with looseness and stays not restricted along both the circumferential and radial directions. Moreover, the heating element 43 are provided with the slits 65a, 65b and its thermal distortion along the circumferential direction can thus be offset by the slits 65a, 65b. As the result, the heating element 43 can be protected from any thermal stress along the upward and downward directions, the circumferential direction, and the radial direction. Any deflection of the heating element 43 can also be restricted by the projections 56t and the enlarges portions 46a of the pins 46.

If the heating element 43 is arrested at the lower end along the upward and downward directions due to its thermal expansion, its main part 43b which deflects inwardly expands further towards the inner side and can thus offset any irregular distortion. Since the heating element 43 remains secured only at the upper end, it can be protected from any buckling or irregular distortion even if its lower end is arrested due to the physical strength is declined by higher temperatures. As the heating element 43 has the bent end 43a thereof bent, its physical strength is increased and less susceptible to distortion.

After the completion of the processing action, the furnace is rapidly cooled down to a wafer unloading temperature, e.g., 550° C. The cooling of the wafers 12 after the processing action involves opening the air valves 40, 41 to introduce air or inactive gas such as nitrogen gas from the cooling gas supply conduits 37, 38.

The supply of cooling gas from the cooling gas supply conduit 38 is introduced into the interior 39 of the thermal equalizer tube. The supply of cooling gas from the cooling gas supply conduit 37 is introduced into the cooling gas infeed duct 36 and then the tubular space 24. As the passage from the cooling gas infeed duct 36 to the tubular space 24 is not significantly bent, its pressure loss will be minimized while it ensures the smooth flow of the cooling gas. The cooling gas lifting up in the tubular space 24 then moves into the center bores 46b of the pins 46 inserted into the through holes 56h of the thermal insulator materials 56 and further flows from the openings at the heating element 43 side of the pins 46 to the furnace internal space 35 to quickly cool down the two, outer and inner, sides of the heating unit 25.

As described, the pins 46 are arranged of a center bored tubular shape which is opened at one end to the heating element 43 side and at the other end to the tubular space 24 and the cooling gas supply conduit 37. During the cooling action, the cooling gas can be introduced through the pins 46 into the interior at the heater of the furnace thus to improve the speed for cooling the heater or the wafers and enhance the throughput of the wafer processing action. Also, since the pin 46 serves as the retainer for retaining the heating elements and the cooling gas guiding passages conduit, no separate conduits for feeding the cooling gas will be needed while the heating area on the inner wall of the furnace is increased. Moreover, the openings of the pins 46 are located more inward than the heating elements 43, hence protecting the heating elements 43 from be cooled down locally by the cooling gas. Accordingly, the heating elements 43 can be prevented from local deflection, twisting, and fracture and thus suffer from no disconnection or direct contact with the reactive tube 4.

The cooling gas to be introduced into the tubular space 24 is dispersed from the cooling gas infeed duct 36 which is large in the volumetric size and can thus enter the tubular space 24 uniformly while its biasing flow is controlled. Although the cooling gas infeed duct 36 itself is greater in the dissipation of heat, its heat transmitting rate is equal along the radial direction to the other sections of the furnace while the thermal insulator base 58 is provided beneath. Accordingly, the heating module 2 can be protected from escape of heat at its lower end.

When having been moved upwardly in the tubular space 24, the furnace interior space 35, and the thermal equalizer space 39, the cooling gas is discharged from the exhaust conduit 28. The inner thermal insulator 45 is rapidly cooled down by the cooling gas running upwardly through the tubular space 24 and the furnace interior space 35 while the thermal equalizer tube 3 and the reactor tube 4 are cooled down by the cooling gas running upwardly through the furnace interior space 35 and the thermal equalizer space 39.

As the result, the wafers 12 in the reactor tube 4 can quickly be cooled down. The heating elements 43 made of ceramic heater type enables rapid heating up to a higher temperature while the rapid cooling down of the heating module 2 by the cooling gas is carried out.

When the cooling action has been completed, the boat elevator not shown lifts down the boat 5 and the processed wafers 12 are unloaded from the boat 5. In case that the de-pressurizing action is involved, the boat 5 is lifted down after the pressure in the reactor chamber returns back to an atmosphere level.

Finally, other embodiments of the present invention will be described.

The heating elements are not limited to the zigzag sheet form in the above embodiment but may be arranged of a zigzag liner form.

The heating elements are not limited to the vertically stuck up arrangement in the above description but may be placed with their planar sides aligned at an angle to the perpendicular direction or in the horizontal.

In the above embodiment, the pin with an enlarged portion is arranged of a two-piece structure consisting of a pin and a washer. The pin may be formed integrally of a pin and a washer. Although the pin is arranged of a center bored tubular shape, it may be solid while another cooling gas passage is provided separately. It is however preferable to have the pin adapted for acting as the cooling gas passage to increase the heating area and improve the heating efficiency. When another cooling gas passage is provided separately, the pin may preferably be arranged of a solid cylindrical shape. If the pin comes into direct contact with the heating element which has been expanded with an increase and decrease in the temperature by the effect of thermal expansion, its cylindrical shape produces simply a linear contact thus minimizing the local cooling down of the heating element.

Figure 6:
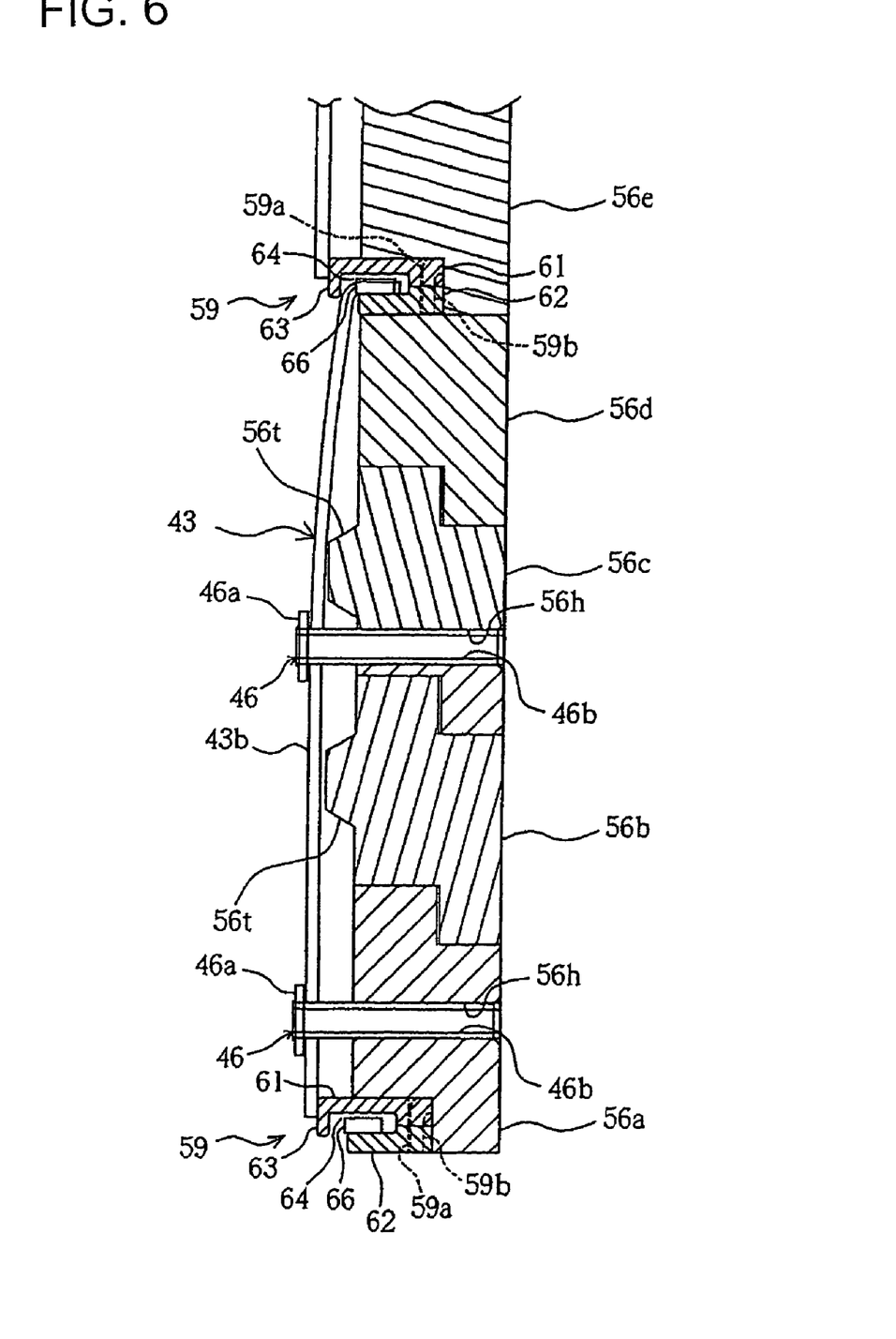
FIG. 6 is a view, similar to FIG. 3, showing another embodiment of the present invention.

The heater supports 59 for supporting the heating elements are not limited to the arrangement described in the embodiment but may be implemented in any proper arrangement for supporting but not dropping the heating elements 43. For example, the heater support 59 may have slots 59a provided therein, as shown in FIG. 6, for securely joining the heating elements 43 by L shaped retainers 59b to the thermal insulator materials 56. A insulator piece 66 is provided in the form of a tiny insulator tube (electrically insulating material) for being accepted by an opening slit provided at the upper in the bent end 43a of the heating element 43, thus preventing any short-circuit between any two adjacent heating elements 43, 43. As the insulator piece 66 is placed in the heating element receiving groove 64 defined between the upper supporting member 62 and the lower supporting member 61, its can be securely held but not slipped off.

The thermal insulator material 56 at the heating element block 57 is formed integral in the above embodiment. However, the thermal insulator material 56 may be composed of separate segments 56a to 56d as shown in FIG. 6. According to the modification, the segments are arranged separately to have a through hole provided therein through which the pin extends and to have a projection provided thereon before being assembled together.

The electrically insulating materials for producing the supports, projections, enlarged portions (washers), pins, insulator tubes, and insulator pieces may be selected from various ceramics containing such as alumina, alumina silica, mullite, zircon, or cossyrite, silicon carbides, and silicon nitrides. Also, the thermally insulation and fireproof materials of the thermal insulators (electrically insulating material) 56 may be selected from ceramic fiber or powder bonded with an organic or inorganic binder. Those materials for forming the thermal insulators and supports may arbitrarily be modified in the type or ingredient depending on the temperature setting employed in the electric heating module.

The pins and the projections are arranged at desired intervals in the above embodiment. The arrangement of the pins and projections is not limited to that of the embodiment illustrated but may be modified where, for example, a number of projections are provided with thermal insulator materials and the pin is positioned between any two adjacent projections or a number of pins with enlarged portions are provided and the projection is positioned between any two adjacent pins.

The above embodiment is described in the form of a substrate processing apparatus. The present invention may be implemented by a heating apparatus used in the substrate processing apparatus with equal success.

As the above embodiment has been described having the foregoing arrangement, it may be defined exclusively in the following manner.

A substrate processing apparatus according to the present invention is provided comprising: a processing chamber where wafers are accommodated and processed; and a heating module equipped with heating elements and thermal insulator materials for heating the wafers with the heating elements in the processing chamber, wherein each of the thermal insulator materials is arranged to have a supporting portion thereof provided for supporting the heating element, each of the heating elements is arranged to have a slit provided therein and to be supported at one end along the lengthwise direction of the slit by the supporting portion of the thermal insulator material so that a space is provided between the inner side of the thermal insulator material and the heating element, the thermal insulator material also has a projection provided on the inner side thereof to extend at an intermediate of the heating element towards the processing chamber so as to come adjacent to or in direct contact with the heating element, and at least a pin provided with an enlarged portion is disposed to extend at the intermediate of the heating element across the slit and the thermal insulator material with its enlarged portion sized greater in the width than the slit and placed adjacent to or in direct contact with the heating element at the processing chamber side of heating element.

Preferably, two or more of the projections may be provided on the thermal insulator material while the pin is positioned between any two adjacent projections. Alternatively, two or more of the pins with enlarged portions may be provided while the projection is positioned between any two adjacent pins. Each the pin with an enlarged portion may be arranged to extend across the heating element and the thermal insulator material at the lower end of the heating element with its enlarged portion remaining adjacent to or indirect contact with the heating element. As its enlarged portion is a washer, the pin may be arranged of a cylindrical shape. The pin and the enlarged portion may be made of an electrically insulating material. The pin may be arranged of a center bored tubular shape which is opened at one end to the inside of the heating element and connected at the other end to a gas supply passage.

Also, a heating apparatus for use in a substrate processing apparatus having a processing chamber where wafers are accommodated and processed, according to the present invention, is provided comprising heating elements and thermal insulator materials for heating the wafers with the heating elements in the processing chamber, wherein each of the thermal insulator materials is arranged to have a supporting portion thereof provided for supporting the heating element, each of the heating elements is arranged to have a slit provided therein and to be supported at one end along the lengthwise direction of the slit by the supporting portion of the thermal insulator material so that a space is provided between the inner side of the thermal insulator material and the heating element, the thermal insulator material also has a projection provided on the inner side thereof to extend at an intermediate of the heating element towards the inner side of heating element so as to come adjacent to or in direct contact with the heating element, and at least a pin provided with an enlarged portion is disposed to extend at the intermediate of the heating element across the slit and the thermal insulator material with its enlarged portion sized greater in the width than the slit and placed adjacent to or in direct contact with the heating element at the inner side of heating element.

Preferably, two or more of the projections may be provided on the thermal insulator material while the pin is positioned between any two adjacent projections. Alternatively, two or more of the pins with enlarged portions may be provided while the projection is positioned between any two adjacent pins. Each the pin with an enlarged portion may be arranged to extend across the heating element and the thermal insulator material at the lower end of the heating element with its enlarged portion remaining adjacent to or indirect contact with the heating element. As its enlarged portion is a washer, the pin may be arranged of a cylindrical shape. The pin and the enlarged portion may be made of an electrically insulating material. The pin may be arranged of a center bored tubular shape which is opened at one end to the inside of the heating element and connected at the other end to a gas supply passage.

A method of manufacturing semiconductors according to the present invention is provided comprising the steps of: loading wafers into a processing chamber; heating and processing the wafers in the processing chamber with the use of the heating element in a heating apparatus, each of the thermal insulator materials arranged to have a supporting portion thereof provided for supporting the heating element, each of the heating elements arranged to have a slit provided therein and to be supported at one end along the lengthwise direction of the slit by the supporting portion of the thermal insulator material so that a space is provided between the inner side of the thermal insulator material and the heating element, the thermal insulator material also having a projection provided on the inner side thereof to extend at an intermediate of the heating element towards the processing chamber so as to come adjacent to or indirect contact with the heating element, where at least a pin provided with an enlarged portion is isposed to extend at the intermediate of the heating element across the slit and the thermal insulator material with its enlarged portion sized greater in the width than the slit and placed adjacent to or in direct contact with the heating element at the processing chamber side of heating element; and unloading the processed wafers from the processing chamber.

The method of manufacturing semiconductors may be modified further comprising a step of, while the pin is arranged of a center bored tubular shape which is opened at one end to the inside of the heating element and connected at the other end to a gas supply passage, allowing a gas supplied from the gas supply passage to run through the center bore of the pin before leaving from the opening. The gas may be a cooling gas for cooling down the interior of the processing chamber.

A heating element supporting structure for use in a substrate processing apparatus having a processing chamber where wafers are accommodated and processed, according to the present invention, is provided comprising heating elements and thermal insulator materials, wherein each of the thermal insulator materials is arranged to have a supporting portion thereof provided for supporting the heating element, each of the heating elements is arranged to have a slit provided therein and to be supported at one end along the lengthwise direction of the slit by the supporting portion of the thermal insulator material so that a space is provided between the inner side of the thermal insulator material and the heating element, the thermal insulator material also has a projection provided on the inner side thereof to extend at an intermediate of the heating element towards the inner side of heating element so as to come adjacent to or indirect contact with the heating element, and at least a pin provided with an enlarged portion is disposed to extend at the intermediate of the heating element across the slit and the thermal insulator material with its enlarged portion sized greater in the width than the slit and placed adjacent to or in direct contact with the heating element at the inner side of heating element.

Another substrate processing apparatus according to the present invention is provided comprising: a processing chamber where wafers are accommodated and processed; and a heating module equipped with heating elements and thermal insulator materials for heating the wafers with the heating elements in the processing chamber, wherein each of the thermal insulator materials is arranged to have a supporting portion thereof provided for supporting the heating element, each of the heating elements is arranged to have a slit provided therein and to be supported at one end along the lengthwise direction of the slit by the supporting portion of the thermal insulator material so that a space is provided between the inner side of the thermal insulator material and the heating element, and at least a pin provided with an enlarged portion is disposed to extend at the intermediate of the heating element across the slit and the thermal insulator material with its enlarged portion sized greater in the width than the slit and placed adjacent to or in direct contact with the heating element at the processing chamber side of heating element.

Another heating apparatus for use in a substrate processing apparatus having a processing chamber where wafers are accommodated and processed, according to the present invention, is provided comprising heating elements and thermal insulator materials for heating the wafers with the heating elements in the processing chamber, wherein each of the thermal insulator materials is arranged to have a supporting portion thereof provided for supporting the heating element, each of the heating elements is arranged to have a slit provided therein and to be supported at one end along the lengthwise direction of the slit by the supporting portion of the thermal insulator material so that a space is provided between the inner side of the thermal insulator material and the heating element, and at least a pin provided with an enlarged portion is disposed to extend at the intermediate of the heating element across the slit and the thermal insulator material with its enlarged portion sized greater in the width than the slit and placed adjacent to or in direct contact with the heating element at the inner side of heating element.

Another method of manufacturing semiconductors according to the present invention is provided comprising the steps of: loading wafers into a processing chamber; heating and processing the wafers in the processing chamber with the use of the heating element in a heating apparatus, each of the thermal insulator materials arranged to have a supporting portion thereof provided for supporting the heating element, each of the heating elements arranged to have a slit provided therein and to be supported at one end along the lengthwise direction of the slit by the supporting portion of the thermal insulator material so that a space is provided between the inner side of the thermal insulator material and the heating element, where at least a pin provided with an enlarged portion is disposed to extend at the intermediate of the heating element across the slit and the thermal insulator material with its enlarged portion sized greater in the width than the slit and placed adjacent to or in direct contact with the heating element at the processing chamber side of heating element; and unloading the processed wafers from the processing chamber.

Another heating element supporting structure for use in a substrate processing apparatus having a processing chamber where wafers are accommodated and processed, according to the present invention, is provided comprising heating elements and thermal insulator materials, wherein each of the thermal insulator materials is arranged to have a supporting portion thereof provided for supporting the heating element, each of the heating elements is arranged to have a slit provided therein and to be supported at one end along the lengthwise direction of the slit by the supporting portion of the thermal insulator material so that a space is provided between the inner side of the thermal insulator material and the heating element, and at least a pin provided with an enlarged portion is disposed to extend at the intermediate of the heating element across the slit and the thermal insulator material with its enlarged portion sized greater in the width than the slit and placed adjacent to or indirect contact with the heating element at the inner side of heating element.

The method of manufacturing semiconductors may be modified further comprising a step of, while the pin is arranged of a center bored tubular shape which is opened at one end to the inside of the heating element and connected at the other end to a gas supply passage, allowing a gas supplied from the gas supply passage to run through the center bore of the pin before leaving from the opening. The gas may be a cooling gas for cooling down the interior of the processing chamber.

INDUSTRIAL APPLICABILITY

The substrate processing apparatus according to the present invention can favorably be utilized in a system of manufacturing semiconductor devices for conducting deposition of thin layers, annealing, diffusion of impurities, and etching processed over a substrate such as a silicon wafer or a glass substrate as is applicable to a range of heating from the room temperature to 1400° C. The heating apparatus according to the present invention can also be employed as a heater in a substrate processing apparatus for conducting the above described steps.

What is claimed is:

1. A substrate processing apparatus comprising: a processing chamber where wafers are accommodated and processed; and a heating module equipped with heating elements and thermal insulator materials for heating the wafers with the heating elements in the processing chamber, wherein
    each of the thermal insulator materials is arranged to have a supporting portion thereof provided for supporting the heating element,
    each of the heating elements is arranged of a laterally extending belt-like shape when opened, which has a slit cut on a band plate thus forming a zigzag shape and to be supported at the upper end portion along the lengthwise direction of the slit by the supporting portion of the thermal insulator material and to be extended downwardly so that a space is provided between the inner side of the thermal insulator material and the heating element,
    the thermal insulator material also has a projection provided on the inner side thereof to extend at an intermediate of the heating element towards the processing chamber so as to come adjacent to or in direct contact with the heating element, and
    at least a pin provided with an enlarged portion is disposed to extend at the intermediate of the heating element across the slit and the thermal insulator
    material with its enlarged portion sized greater in the width than the slit and placed adjacent to or in direct contact with the heating element at the processing chamber side of heating element.

2. A substrate processing apparatus according to claim 1, wherein two or more of the projections are provided on the thermal insulator material and the pin is positioned between any two adjacent projections.

3. A substrate processing apparatus according to claim 1, wherein two or more of the pins with enlarged portions are provided and the projection is positioned between any two adjacent pins.

4. A substrate processing apparatus according to claim 1, wherein each the pin with an enlarged portion is arranged to extend across the heating element and the thermal insulator material at the lower end of the heating element with its enlarged portion remaining adjacent to or in direct contact with the heating element.

5. A substrate processing apparatus according to claim 1, wherein its enlarged portion is a washer while the pin is arranged of a cylindrical shape.

6. A substrate processing apparatus according to claim 1, wherein the pin and the enlarged portion is made of an electrically insulating material.

7. A substrate processing apparatus according to claim 1, wherein the pin is arranged of a center bored tubular shape which is opened at one end to the inside of the heating element and connected at the other end to a gas supply passage.

8. A heating apparatus for use in a substrate processing apparatus having a processing chamber where wafers are accommodated and processed, comprising heating elements and thermal insulator materials for heating the wafers with the heating elements in the processing chamber, wherein
    each of the thermal insulator materials is arranged to have a supporting portion thereof provided for supporting the heating element,
    each of the heating elements is arranged of a laterally extending belt-like shape when opened, which has a slit cut on a band plate thus forming a zigzag shape and to be supported at the upper end portion along the lengthwise direction of the slit by the supporting portion of the thermal insulator material and to be extended downwardly so that a space is provided between the inner side of the thermal insulator material and the heating element,
    the thermal insulator material also has a projection provided on the inner side thereof to extend at an intermediate of the heating element towards the inner side of heating element so as to come adjacent to or in direct contact with the heating element, and
    at least a pin provided with an enlarged portion is disposed to extend at the intermediate of the heating element across the slit and the thermal insulator material with its enlarged portion sized greater in the width than the slit and placed adjacent to or in direct contact with the heating element at the inner side of heating element.

9. A heating apparatus according to claim 8, wherein two or more of the projections are provided on the thermal insulator material and the pin is positioned between any two adjacent projections.

10. A heating apparatus according to claim 8, wherein two or more of the pins with enlarged portions are provided and the projection is positioned between any two adjacent pins.

11. A heating apparatus according to claim 8, wherein each the pin with an enlarged portion is arranged to extend across the heating element and the thermal insulator material at the lower end of the heating element with its enlarged portion remaining adjacent to or in direct contact with the heating element.

12. A heating apparatus according to claim 8, wherein its enlarged portion is a washer while the pin is arranged of a cylindrical shape.

13. A heating apparatus according to claim 8, wherein the pin and the enlarged portion are made of an electrically insulating material.

14. A heating apparatus according to claim 8, wherein the pin is arranged of a center bored tubular shape which is opened at one end to the inside of the heating element and connected at the other end to a gas supply passage.

15. A method of manufacturing semiconductors comprising the steps of:
    loading wafers into a processing chamber;
    heating and processing the wafers in the processing chamber with the use of the heating element in a heating apparatus, each of the thermal insulator materials arranged to have a supporting portion thereof provided for supporting the heating element, each of the heating elements arranged of a laterally extending belt-like shape when opened, which has a slit cut on a band plate thus forming a zigzag shape and to be supported at the upper end portion along the lengthwise direction of the slit by the supporting portion of the thermal insulator material and to be extended downwardly so that a space is provided between the inner side of the thermal insulator material and the heating element, the thermal insulator material also having a projection provided on the inner side thereof to extend at an intermediate of the heating element towards the processing chamber so as to come adjacent to or in direct contact with the heating element, where at least a pin provided with an enlarged portion is disposed to extend at the intermediate of the heating element across the slit and the thermal insulator material with its enlarged portion sized greater in the width than the slit and placed adjacent to or in direct contact with the heating element at the processing chamber side of heating element; and unloading the processed wafers from the processing chamber.

16. A method of manufacturing semiconductors according to claim 15, further comprising a step of, while the pin is arranged of a center bored tubular shape which is opened at one end to the inside of the heating element and connected at the other end to a gas supply passage, allowing a gas supplied from the gas supply passage to run through the center bore of the pin before leaving from the opening.

17. A method of manufacturing semiconductors according to claim 16, wherein the gas is a cooling gas for cooling down the interior of the processing chamber.

18. A heating element supporting structure for use in a substrate processing apparatus having a processing chamber where wafers are accommodated and processed, comprising heating elements and thermal insulator materials, wherein each of the thermal insulator materials is arranged to have a supporting portion thereof provided for supporting the heating element, each of the heating elements is arranged of a laterally extending belt-like shape when opened, which has a slit cut on a band plate thus forming a zigzag shape and to be supported at the upper end portion along the lengthwise direction of the slit by the supporting portion of the thermal insulator material and to be extended downwardly so that a space is provided between the inner side of the thermal insulator material and the heating element, the thermal insulator material also has a projection provided on the inner side thereof to extend at an intermediate of the heating element towards the inner side of heating element so as to come adjacent to or in direct contact with the heating element, and at least a pin provided with an enlarged portion is disposed to extend at the intermediate of the heating element across the slit and the thermal insulator material with its enlarged portion sized greater in the width than the slit and placed adjacent to or in direct contact with the heating element at the inner side of heating element.

19. A substrate processing apparatus comprising:

a processing chamber where wafers are accommodated and processed; and a heating module equipped with heating elements and thermal insulator materials for heating the wafers with the heating elements in the processing chamber, wherein each of the thermal insulator materials is arranged to have a supporting portion thereof provided for supporting the heating element, each of the heating elements is arranged of a laterally extending belt-like shape when opened, which has a slit cut on a band plate thus forming a zigzag shape and to be supported at the upper end portion along the lengthwise direction of the slit by the supporting portion of the thermal insulator material and to be extended downwardly so that a space is provided between the inner side of the thermal insulator material and the heating element, and at least a pin provided with an enlarged portion is disposed to extend at the intermediate of the heating element across the slit and the thermal insulator material with its enlarged portion sized greater in the width than the slit and placed adjacent to or in direct contact with the heating element at the processing chamber side of heating element.

20. A heating apparatus for use in a substrate processing apparatus having a processing chamber where wafers are accommodated and processed, comprising heating elements and thermal insulator materials for heating the wafers with the heating elements in the processing chamber, wherein each of the thermal insulator materials is arranged to have a supporting portion thereof provided for supporting the heating element, each of the heating elements is arranged of a laterally extending belt-like shape when opened, which has a slit cut on a band plate thus forming a zigzag shape and to be supported at the upper end portion along the lengthwise direction of the slit by the supporting portion of the thermal insulator material and to be extended downwardly so that a space is provided between the inner side of the thermal insulator material and the heating element, and at least a pin provided with an enlarged portion is disposed to extend at the intermediate of the heating element across the slit and the thermal insulator material with its enlarged portion sized greater in the width than the slit and placed adjacent to or in direct contact with the heating element at the inner side of heating element.

21. A method of manufacturing semiconductors comprising the steps of:

loading wafers into a processing chamber;

heating and processing the wafers in the processing chamber with the use of the heating element in a heating apparatus, each of the thermal insulator materials arranged to have a supporting portion thereof provided for supporting the heating element, each of the heating elements arranged of a laterally extending belt-like shape when opened, which has a slit cut on a band plate thus forming a zigzag shape and to be supported at the upper end portion along the lengthwise direction of the slit by the supporting portion of the thermal insulator material and to be extended downwardly so that a space is provided between the inner side of the thermal insulator material and the heating element, where at least a pin provided with an enlarged portion is disposed to extend at the intermediate of the heating element across the slit and the thermal insulator material with its enlarged portion sized greater in the width than the slit and placed adjacent to or in direct contact with the heating element at the processing chamber side of heating element; and unloading the processed wafers from the processing chamber.

22. A heating element supporting structure for use in a substrate processing apparatus having a processing chamber where wafers are accommodated and processed, comprising heating elements and thermal insulator materials, wherein

- each of the thermal insulator materials is arranged to have a supporting portion thereof provided for supporting the heating element,
- each of the heating elements is arranged of a laterally extending belt-like shape when opened, which has a slit cut on a band plate thus forming a zigzag shape and to be supported at the upper end portion along the lengthwise direction of the slit by the supporting portion of the thermal insulator material and to be extended downwardly so that a space is provided between the inner side of the thermal insulator material and the heating element,
- at least a pin provided with an enlarged portion is disposed to extend at the intermediate of the heating element across the slit and the thermal insulator material with its enlarged portion sized greater in the width than the slit and placed adjacent to or in direct contact with the heating element at the inner side of heating element.

* * * * *